United States Patent [19]

Purdes

[11] Patent Number: 4,699,085
[45] Date of Patent: Oct. 13, 1987

[54] CHEMICAL BEAM EPITAXY SYSTEM

[75] Inventor: Andrew J. Purdes, Garland, Tex.

[73] Assignee: Texas Instruments Incorporated, Dallas, Tex.

[21] Appl. No.: 903,357

[22] Filed: Sep. 3, 1986

[51] Int. Cl.⁴ ............................................. C23C 8/06
[52] U.S. Cl. .................................. 118/725; 118/715; 118/719; 118/730
[58] Field of Search ................ 118/719, 725, 730, 715

[56] References Cited
PUBLICATIONS

Tsang, Chemical Beam Epitaxy of InP and GaAs, Appl. Phys. Lett (45), 1234 (1984).

*Primary Examiner*—Richard Bueker
*Attorney, Agent, or Firm*—Carlton H. Hoel; Leo N. Heiting; Melvin Sharp

[57] ABSTRACT

A chemical beam epitaxy system including a cylindrical vacuum chamber (32) with wafer heaters (42) affixed about the cylindrical wall, a rotatable wafer holder ring (40) with mounted wafer holders (38) adjacent the wafer heaters (42), and a central rotatble set of gas cells (44) for directing chemical beams (50, 54) across wafers (52) in the wafer holders (38).

7 Claims, 4 Drawing Figures

CHEMICAL BEAM EPITAXY SYSTEM

BACKGROUND OF THE INVENTION

1. Field of the Invention.

The present invention relates to crystal growth, and, more particularly, to epitaxial growth of semiconductors.

2. Description of the Related Art.

Epitaxial growth of electronic grade semiconductors such as gallium arsenide (GaAs) relies on methods such as liquid phase epitaxy (LPE), molecular beam epitaxy (MBE), and metalorganic chemical vapor deposition (MOCVD). MBE and MOCVD both provide the ability to grow extremely abrupt p-n junctions and heterojunctions of lattice-matched materials; and such abrupt junctions are required for fabrication of superlattices and quantum well structures. However, both MBE and MOCVD have serious shortcomings, and recently chemical beam epitaxy (CBE) has been proposed as a system to overcome these shortcomings by combining features of MBE and MOCVD; see, W. Tsang, Chemical Beam Epitaxy of InP and GaAs. 45 Appl. Phys. Lett. 1234 (1984).

The CBE system of Tsang (FIG. 1 is a schematic illustration) has the basic structure of an MBE system: a hemispheral vacuum chamber with sources arranged on the curved surface and aimed at the wafer holder located at the chamber center. The sources in MBE systems are effusion cells containing solid or molten elements (for example, growth of layers of $Al_xGa_{1-x}As$ with various x values and with silicon for n doping requires a cell for each of aluminum, gallium, arsenic, and silicon). Good uniformity across a wafer for MBE grown layers despite the nonuniformity of the elemental fluxes from the effusion cells can be achieved by rotation of the wafer during growth. A wafer is heated typically to 500° to 700° C. for growth to insure sufficient surface mobility of the deposited atoms so they can easily migrate to the appropriate lattice sites. In short, the growth conditions require simultaneous ultra-high high vacuum, mechanical rotation, and heat for the wafers. These conditions pose a reliability problem for the wafer holders. The CBE system replaces some or all of the conventional elemental effusion cells with cells that are outlets of tanks of metalorganic gasses (for example, trimethylaluminum (TMAl), triethylgallium (TEGa), and trimethylarsine (TMAs)). This substitution solves the MBE problems of effusion cell life and flux drift, and the CBE cells are much simpler than the MBE effusion cells; but the problems of simultaneous high vacuum, mechanical rotation, and heat still remain.

The limited angle of flux produced by an MBE effusion cell or a CBE cell makes multiwafer operation very difficult. Movement of wafers past a stationary bank of MBE or CBE cells is not practical due to the complexity of such an arrangement (and the flux drift of MBE cells). Thus a problem of small throughput exists for both MBE and CBE.

SUMMARY OF THE INVENTION

The present invention provides a chemical beam epitaxy (CBE) system with multiple wafers held in a fixed circular arrangement about an oscillating set of radially aimed chemical beam sources. In preferred embodiments each wafer is mounted on its own individual holder, the heaters for these wafer holders are rigidly attached to the walls of a cylindrical vacuum chamber, the wafer holders are mounted on an assembly which can be rotated to index the various wafer holders in front of a wafer loadlock for loading and unloading, the wafers are stationary during epitaxial growth and are directly opposite the heaters affixed to the chamber walls, the multiple gas sources are mounted along the cylindrical axis of the vacuum chamber with their fluxes directed radially outward toward the heated wafers, the gas sources rotate during growth insuring that each wafer intercepts the same average flux during the course of a growth run, the gas sources also oscillate along the axis to improve uniformity within a wafer, the spent gasses are exhausted at the bottom of the chamber using a symmetrical pumping arrangement, and baffle plates are used to insure that each wafer experiences a similar vacuum environment during growth.

This solves the problems of the known MBE and CBE systems by separating the heating of the wafers from the relative beam motion across the wafers and by simple arrangements for simultaneous epitaxy on multiple wafers.

BRIEF DESCRIPTION OF THE DRAWINGS

The drawings are schematic for clarity.

DESCRIPTION OF THE PREFERRED EMBODIMENTS

Figure 2A:
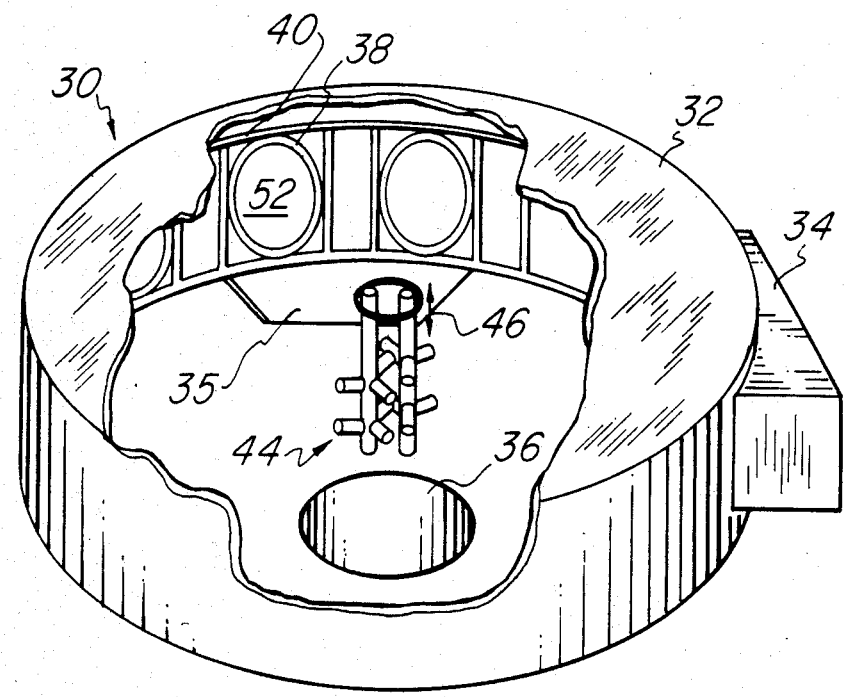
FIGS. 2A-B are cutaway perspective and plan views of a first preferred embodiment CBE system.
Figure 2B:
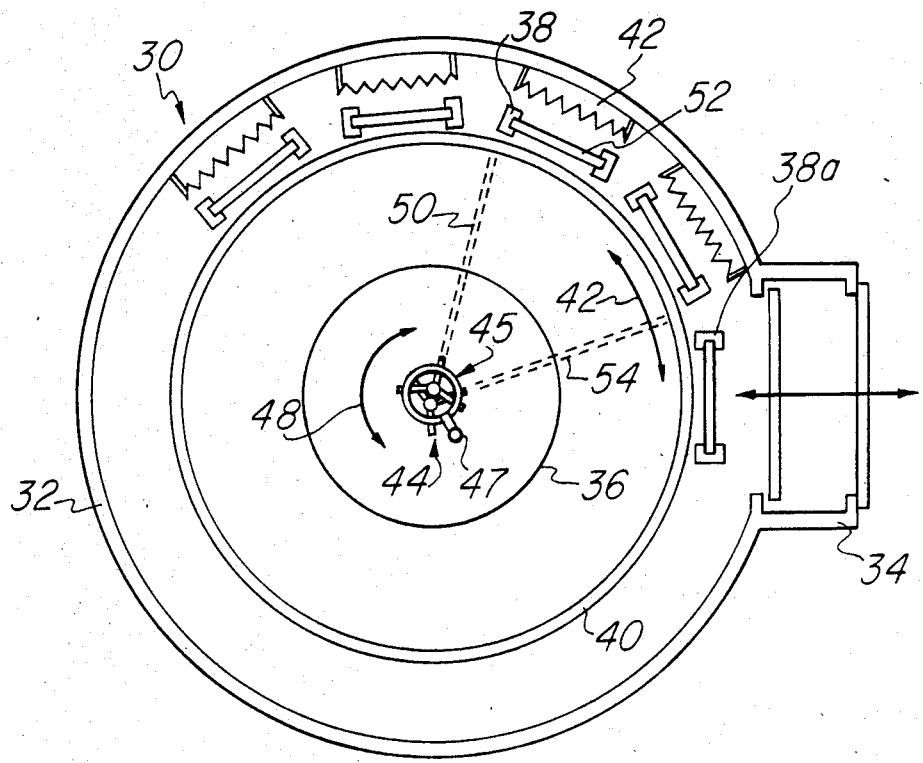

A first preferred embodiment CBE system, generally denoted by reference numeral 30, is schematically shown in cutaway perspective and plan views in FIGS. 2A-B and includes ultrahigh vacuum chamber 32 with wafer loadlock 34, baffles 35 and vacuum pump connection 36 leading to vacuum pumps not shown for clarity, wafer holders 38 attached to holder ring 40 which in turn is held on tracks inside of chamber 32 so that ring 40 can be rotated (as indicated by arrow 42) to bring an individual wafer holder 38a to a position for removal through loadlock 34, wafer heaters 42 affixed to the walls of chamber 32, gas cells 44 which oscillate both vertically (as indicated by arrow 46) and rotationally (as indicated by arrow 48), and liquid nitrogen jacketing for chamber 32 which is not shown for clarity. Chamber 32 has an approximately 50 cm inside diameter and 20 cm inside height. Wafer heaters 42 are resistive heaters, and baffles 35 insure each wafer position has the same pumping environment.

An example of the operation of system 30 to grow alternating layers of GaAs and $Al_xGa_{1-x}As$ on GaAs wafer 52 is as follows. Initially, vacuum pumps attached to connections 36 evacuate chamber 32 to a low pressure such as $10^{-10}$ Torr and hold this low pressure to outgas adsorbed contaminates; after the outgassing is completed, the liquid nitrogen jacket is filled. Next, wafer 52 mounted in a wafer holder 38 and previously cleaned is introduced into chamber 32 through loadlock 34 and attached to holder ring 40 as shown by holder 38a in FIG. 2B. Then holder ring 40 is rotated to bring wafer 52 held in wafer holder 38 to a position adjacent one of the wafer heaters 42, and wafer heater 42 is activated to bring the temperature of wafer 52 up to a growth temperature of about 550° C.

Once wafer 52 is up to growth temperature, beam 50 of triethylgallium (TEGa) and trimethylaluminum (TMAl) molecules mixed with hydrogen as a carrier gas is directed at wafer 52 from one of the gas cells 44. Gas cells 44 have multiple vertical outlets (see FIG. 3 for a detailed illustration of gas cells 44) to cover the height of wafer 52 and, additionally, oscillate vertically (indicated by arrow 46 in FIG. 2A) to insure vertical average uniformity of beam 50. Beam 50 is fairly narrow, so gas cells 44 rotate (indicated by arrow 48 in FIG. 2B) to insure horizontal average uniformity. The rotation may be in a single direction or oscillatory to simplify the sealing. The pressure in chamber 32 during growth is about $10^{-4}$ to $10^{-3}$ Torr, so the mean free path of the molecules in beam 50 is much greater than the distance from gas cells 44 to wafer 52 (about 15 cm) and little scattering occurs to spread beam 50. A TEGa or TMAl molecule from beam 50 that impinges on wafer 52 at growth temperature dissociates, ejecting three alkyl radicals and leaving a Ga or Al atom on wafer 52.

Figure 1:
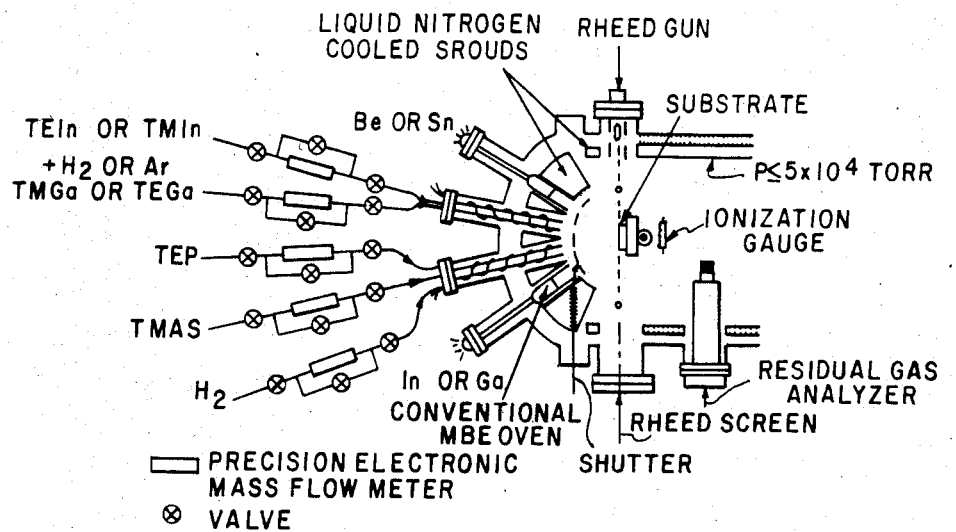
FIG. 1 illustrates a known CBE system.
Figure 3:
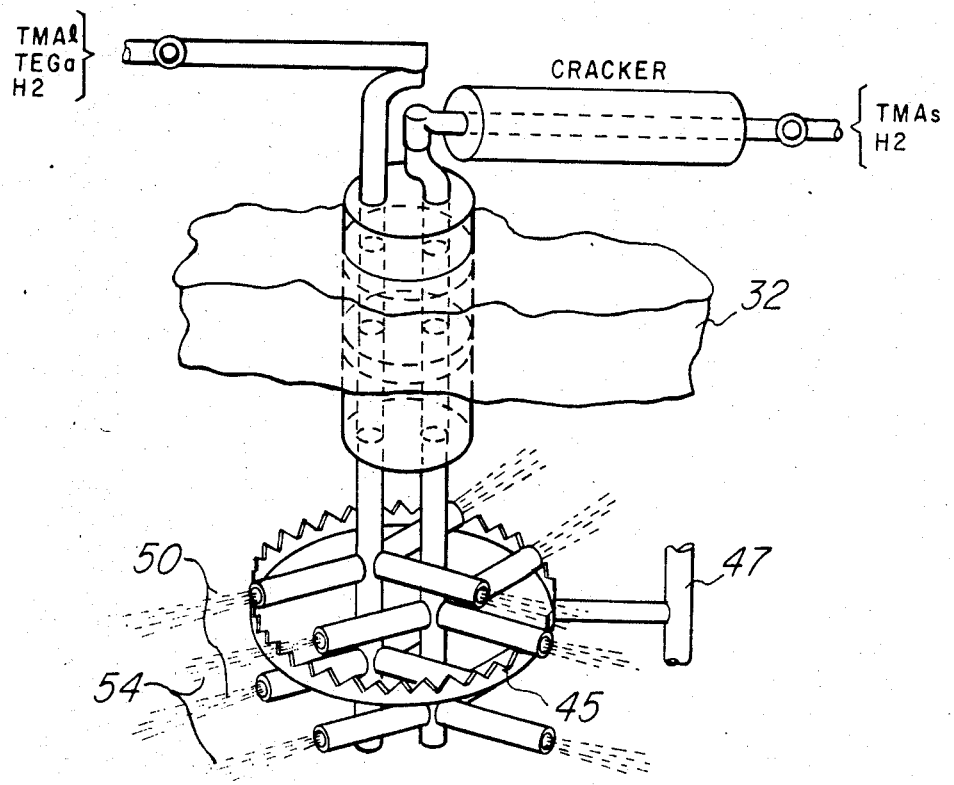
FIG. 3 is a detailed view of the gas cells of the first preferred embodiment.

At the same time beam 50 is impinging on wafer 52, beam 54 of arsenic (mostly in the form of dimers $As_2$) mixed with hydrogen as a carrier gas and alkyl radicals is emanating from another of gas cells 44 and will impinge on wafer 52 as gas cells 44 rotate. Gas cells 44 rotate at approximately one revolution per second, so the time interval between beam 50 and beam 54 on wafer 52 is about 170 milliseconds if gas cells 44 consist of six separate cells as indicated in FIG. 2B. The sticking coefficients of Ga and Al on the wafer surface is near unity, so the 170 milisecond interval does not result in evaporation of the Ga and Al prior to the arsenic arrival. The flux of arsenic in beam 54 is greater than the flux of Ga and Al in beam 50, so the epitaxial growth is in the presence of an excess of arsenic. The arsenic in beam 54 derives from cracking trimethylarsine (TMAs) at about 1100° C. just prior to injection into chamber 32; see FIG. 3 schematically illustrating a simplified version of gas cells 44. Note that disk-shaped resistive heaters 45 for the outlets of gas cells 44 can be affixed in chamber 32 by placing a vertical support 47 between the chamber axis and loadlock so that the support does not disrupt the chemical beams when aimed at a wafer. Note that the pressure in chamber 32 is mostly due to the ethyl and methyl radicals and the carrier hydrogen.

The switching from growth of a GaAs layer to growth of an $Al_xGa_{1-x}As$ layer is simply by opening the valve on the TMAl; the ratio of TMAl to TEGa determines the x value. Thus the growth of alternating layers of GaAs and $Al_xGa_{1-x}As$ is due to the opening and closing of the TMAl valve.

A ring of shutters may be attached to gas cells 44 mounting so particular cells can be shuttered, and a shutter for each wafer growth location (each heater 42) between gas cells 44 and the wafer can be synchronized with the rotation of gas cells 44 permitting different compounds to be simultaneously grown on different wafers. Shutters generally can be used to overcome transient flow effects arising during valving; this permits very abrupt compositional and doping changes. However, system 30 has the additional capability of stopping the rotation of gas cells 44 with the beams between wafers during valving to avoid transient flow effects. Thus the number of wafer heaters 42 plus the number displaced by loadlock 34 preferably equals the number of radial directions of outlets of gas cells 44; this allows all of the beams to simultaneously impinge of wafers (or the loadlock) or simultaneously be between wafers.

MODIFICATIONS AND ADVANTAGES

Various modifications of the preferred embodiment devices and methods may be made while retaining the features of separating the relative motion of the molecular beams on the wafer from the wafer heating and the multiwafer arrangement such separating provides. For example, the gas cells could include two or more cells aimed in the same direction so there would be no time delay between the chemical beams impinging on the wafer surface. The chamber could be elongated axially so that multiple wafers could be stacked vertically, or could have various cross sectional shapes such as hexagonal or octagonal.

What is claimed is:

1. A chemical beam epitaxy system for growth on a semiconductor wafer, comprising:
   (a) a vacuum chamber;
   (b) a wafer holder mounted in said chamber for holding a semiconductor wafer; and
   (c) movable gas cells in said chamber, said gas cells including (i) connections to sources of chemical beam gasses external to said chamber, (ii) beam-forming outlets for said gasses within said chamber, (iii) movement apparatus for moving the direction of said outlets so beams emanating from said outlets move across said wafer in said wafer holder.

2. The system of claim 1, further comprising:
   (a) a wafer heater affixed to said chamber and located so that said wafer holder can hold said wafer adjacent said wafer heater.

3. The system of claim 2, wherein:
   (a) said wafer holder is movable between positions for said wafer adjacent said heater and adjacent a loadlock on said chamber.

4. A chemical beam epitaxy system for growth on semiconductor wafers, comprising:
   (a) a cylindrical vacuum chamber;
   (b) a plurality of wafer holders attached to a holder ring mounted in said chamber, said holder ring rotatable about the axis of said cylindrical chamber, and said wafer holders for holding semiconductor wafers;
   (c) movable gas cells in said chamber and located about the chamber axis, said gas cells including (i) connections to sources of chemical beam gasses external to said chamber, (ii) beam-forming outlets for said gasses within said chamber and aimed radially, (iii) apparatus for rotating the direction of said outlets so beams emanating from said outlets move across wafers held in said wafer holders.

5. The system of claim 4, further comprising:
   (a) a plurality of wafer heaters affixed to said chamber and located so that said wafer holders can hold said wafers adjacent said wafer heaters.

6. The system of claim 5, wherein:
   (a) said holder ring is rotatable between positions for said wafers adjacent said heaters and adjacent a loadlock on said chamber.

7. The system of claim 5; wherein:
   (a) said gas cells may oscillate both along and about the axis of said chamber.

* * * * *